(12) United States Patent
Lee et al.

(10) Patent No.: US 7,718,476 B2
(45) Date of Patent: May 18, 2010

(54) DISPLAY APPARATUS AND FABRICATING METHOD THEREOF

(75) Inventors: Joo-hyeon Lee, Yongin-si (KR); Young-ho Kang, Incheon (KR)

(73) Assignee: Samsung Electronics Co., Ltd. (KR)

( * ) Notice: Subject to any disclaimer, the term of this patent is extended or adjusted under 35 U.S.C. 154(b) by 509 days.

(21) Appl. No.: 11/674,446

(22) Filed: Feb. 13, 2007

(65) Prior Publication Data

US 2007/0187759 A1   Aug. 16, 2007

(30) Foreign Application Priority Data

Feb. 14, 2006   (KR) .................. 10-2006-0014237

(51) Int. Cl.
*H01L 21/00* (2006.01)
*H01L 21/84* (2006.01)

(52) U.S. Cl. ............................. 438/149; 257/E27.111

(58) Field of Classification Search .................. 438/149; 257/E27.111
See application file for complete search history.

(56) References Cited

U.S. PATENT DOCUMENTS

2002/0076847 A1 * 6/2002 Yamada et al. ................ 438/34

FOREIGN PATENT DOCUMENTS

| JP | 11-251057 | * | 9/1999 |
| JP | 11251057 | | 9/1999 |
| JP | 2002175878 | | 6/2002 |
| KR | 1020050067084 | | 6/2005 |

* cited by examiner

*Primary Examiner*—David S Blum
(74) *Attorney, Agent, or Firm*—Cantor Colburn LLP

(57) ABSTRACT

A method of fabricating a display apparatus includes depositing a first layer on a substrate while a mask is disposed at a first distance from the substrate, and forming a second layer on the substrate while the mask is disposed at a second distance larger than the first distance from the substrate after forming the first layer. Thus, the present invention provides a method of fabricating a display apparatus, in which a single mask is used in forming an electron injection layer and a common electrode.

12 Claims, 20 Drawing Sheets

DISPLAY APPARATUS AND FABRICATING METHOD THEREOF

This application claims priority to Korean Patent Application No. 2006-0014237, filed on Feb. 14, 2006, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and a fabricating method thereof. More particularly, the present invention relates to a display apparatus formed as a result of a simplified fabricating method, and the fabricating method thereof.

2. Description of the Related Art

An organic light emitting diode ("OLED") has recently attracted attention as a flat panel display because it is driven with a low voltage, is thin and lightweight, has a wide view angle, has a relatively short response time, etc.

The OLED includes an insulating substrate, a thin film transistor, a pixel electrode, an organic layer, an electron injection layer, and a common electrode, all of which are stacked on the insulating substrate. Here, the electron injection layer and the common electrode are deposited on an entire surface of the organic layer through masks.

However, the masks, separately needed in forming the electron injection layer and the common electrode, complicate a fabricating process.

BRIEF SUMMARY OF THE INVENTION

Accordingly, it is an aspect of the present invention to provide a method of fabricating a display apparatus, in which a single mask is used in forming an electron injection layer and a common electrode.

Another aspect of the present invention is to provide a display apparatus, in which a single mask is used in forming an electron injection layer and a common electrode.

Additional aspects and/or advantages of the present invention will be set forth in part in the description which follows and, in part, will be obvious from the description, or may be learned by practice of the present invention.

The foregoing and/or other aspects of the present invention include a method of fabricating a display apparatus, the method including depositing a first layer on a substrate while a mask is disposed at a first distance from the substrate, and forming a second layer on the substrate while the mask is disposed at a second distance larger than the first distance from the substrate after forming the first layer.

The first layer may include an electron injecting layer, and the second layer may include a common electrode.

The first layer may be formed in a first region, and the second layer may be formed in the first region and in a second region surrounding the first region.

The method may further include forming an encapsulation passivation film on the second layer while the mask is disposed at a third distance larger than the second distance from the substrate.

The first region may correspond to a display region.

The first layer and the second layer may be formed by a heat evaporation process. The substrate may be formed with an organic layer thereon, and the first layer and the second layer may be formed in a state where the organic layer of the substrate is disposed to face downward. Alternatively, The first layer and the second layer may be formed in a state where the substrate is disposed in a standing direction.

The substrate may be provided by forming a thin film transistor ("TFT") on an insulating substrate, forming a pixel electrode connected to the TFT, and forming an organic layer on the pixel electrode. The organic layer may include material of low molecular weight, and the first layer may include lithium (Li) and fluorine (F). Alternatively, the organic layer may include polymer, and the first layer may include calcium (Ca) and barium (Ba). The second layer may include aluminum (Al) and may have a thickness between 4,000 Å and 8,000 Å.

The foregoing and/or other aspects of the present invention can also be achieved by providing a display apparatus including an insulating substrate, a TFT formed on the insulating substrate and a pixel electrode connected to the TFT, an organic layer formed on the pixel electrode and including a light emitting layer, a first layer formed in a first region and having an outer profile with a first inclination, and a second layer formed in the first region and in a second region surrounding the first region and having an outer profile with a second inclination smaller than the first inclination.

The first layer may include an electron injecting layer, and the second layer may include a common electrode.

The second region may be provided with a common voltage applying part, and the second layer may be electrically connected to the common voltage applying part. A passivation layer may be formed in the first region, in the second region, and in a third region surrounding the second region and may have an outer profile with a third inclination smaller than the first inclination. The second region may include a driving voltage bar to apply a driving voltage, and the organic layer may be at least partially disposed on the driving voltage bar.

The first region may be of a rectangular shape, and the second region may include a first sub-region running parallel with a short side of the first region and a second sub-region running parallel with a long side of the first region, in which the first sub-region is wider than the second sub-region. The common voltage applying part may be provided in the first sub-region and the second sub-region, and the common voltage applying part in the first sub-region may be larger than the common voltage applying part in the second sub-region.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE INVENTION

Figure 1:
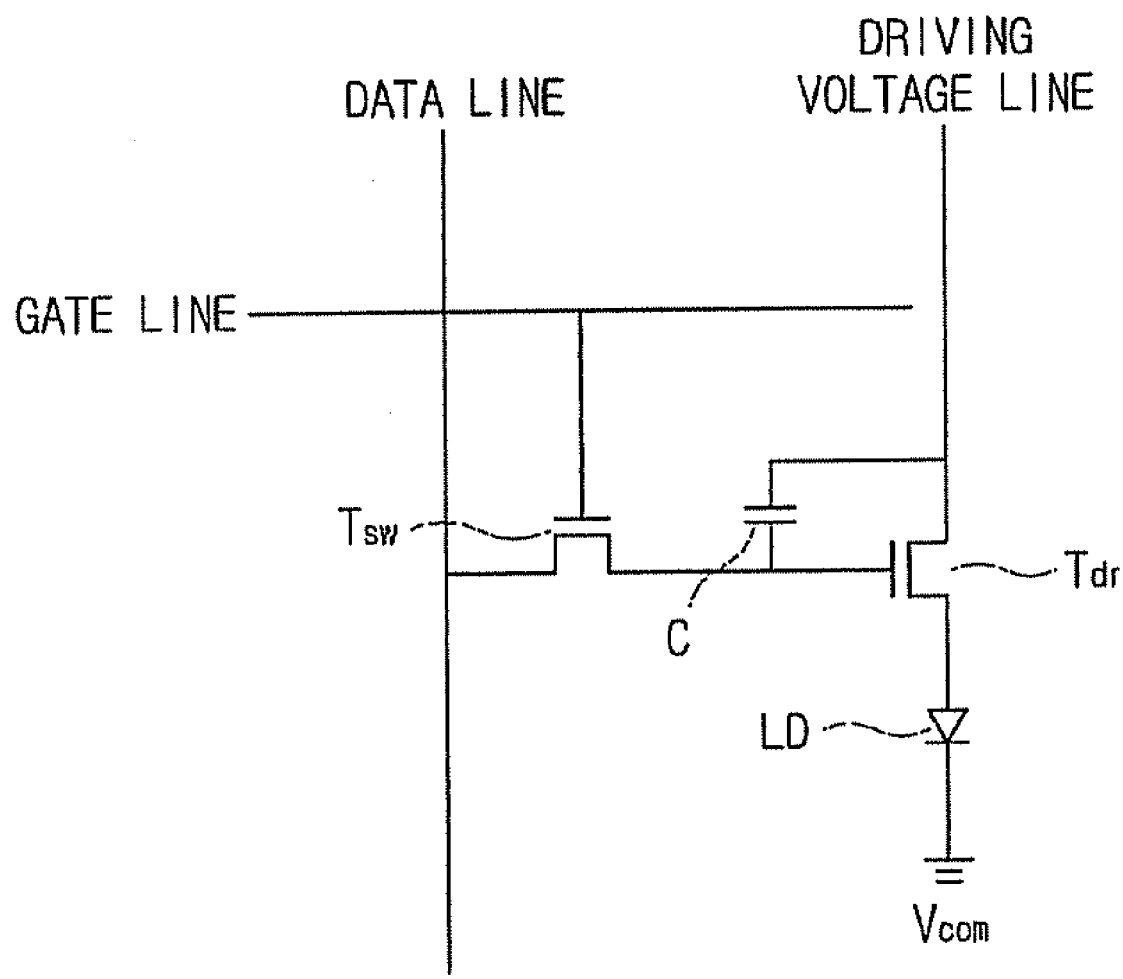
FIG. 1 is an equivalent circuit diagram of an exemplary display apparatus according to a first exemplary embodiment of the present invention.

Hereinafter, embodiments of the present invention will be described with reference to accompanying drawings, wherein like numerals refer to like elements and repetitive descriptions will be avoided as necessary. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Further, a term of "on" means that a new layer (i.e., film) may be interposed or not interposed between two layers (i.e., films), and a term of "directly on" means that two layers (i.e. films) are in contact with each other. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

FIG. 1 is an equivalent circuit diagram of an exemplary display apparatus according to a first exemplary embodiment of the present invention.

A pixel is provided with a plurality of signal lines. The signal lines include a gate line to transmit a scan signal, otherwise known as a gate signal, a data line to transmit a data signal, and a driving voltage line to transmit a driving voltage. Here, the data line and the driving voltage line are adjacent to and parallel with each other. On the other hand, the gate line is extended perpendicularly to the data line and the driving voltage line.

Each pixel includes an organic light emitting device LD, a switching thin film transistor ("TFT") Tsw, a driving TFT Tdr, and a capacitor C.

The driving TFT Tdr has a control terminal, such as a gate electrode, connected to the switching TFT Tsw, an input terminal, such as a source electrode, connected to the driving voltage line, and an output terminal, such as a drain electrode, connected to the organic light emitting device LD.

The organic light emitting device LD has an anode connected to the output terminal of the driving TFT Tdr, and a cathode connected to a common voltage Vcom. The organic light emitting device LD emits light with brightness varying according to the intensity of a current outputted from the driving TFT Tdr, thereby displaying an image. Here, the intensity of the current outputted from the driving TFT Tdr varies according to voltages applied between the control terminal and the output terminal of the driving TFT Tdr.

The switching TFT Tsw has a control terminal, such as a gate electrode, connected to the gate line, an input terminal, such as a source electrode, connected to the data line, and an output terminal, such as a drain electrode, connected to the control terminal of the driving TFT Tdr. The switching TFT Tsw transmits the data signal from the data line to the driving TFT Tdr in response to the scan signal applied to the gate line.

The capacitor C is connected between the control terminal and the input terminal of the driving TFT Tdr. The capacitor C stores and maintains the data signal to be inputted to the control terminal of the driving TFT Tdr.

Figure 2A:
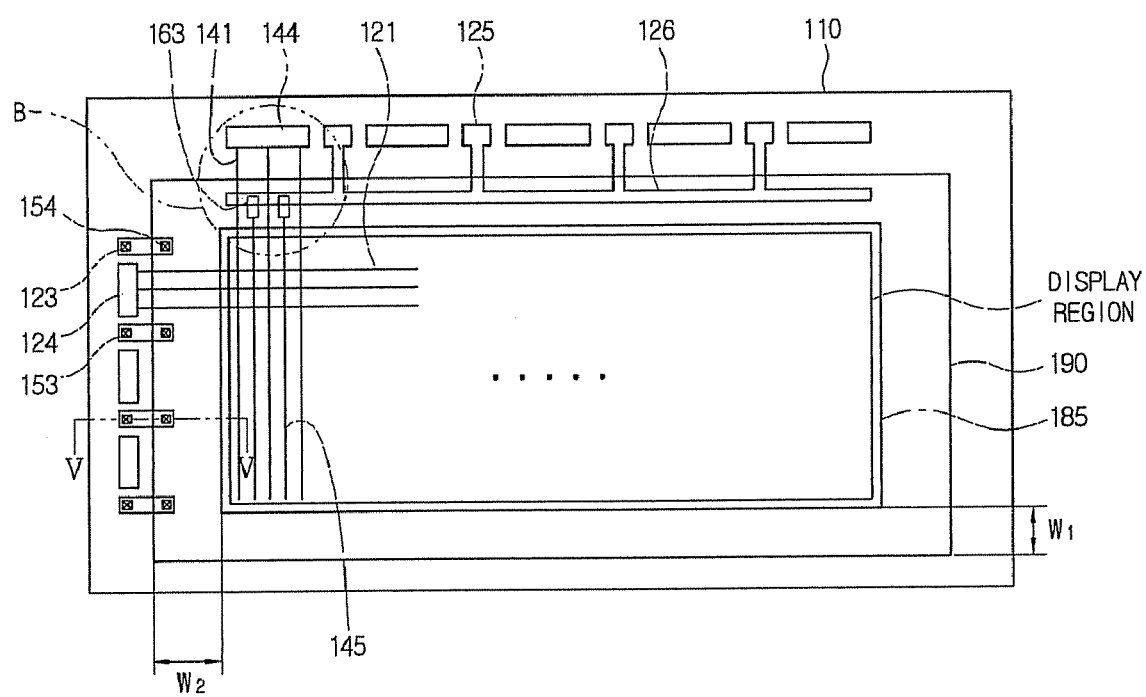
FIGS. 2A and 3 are layout diagrams of the exemplary display apparatus according to the first exemplary embodiment of the present invention.
Figure 5:
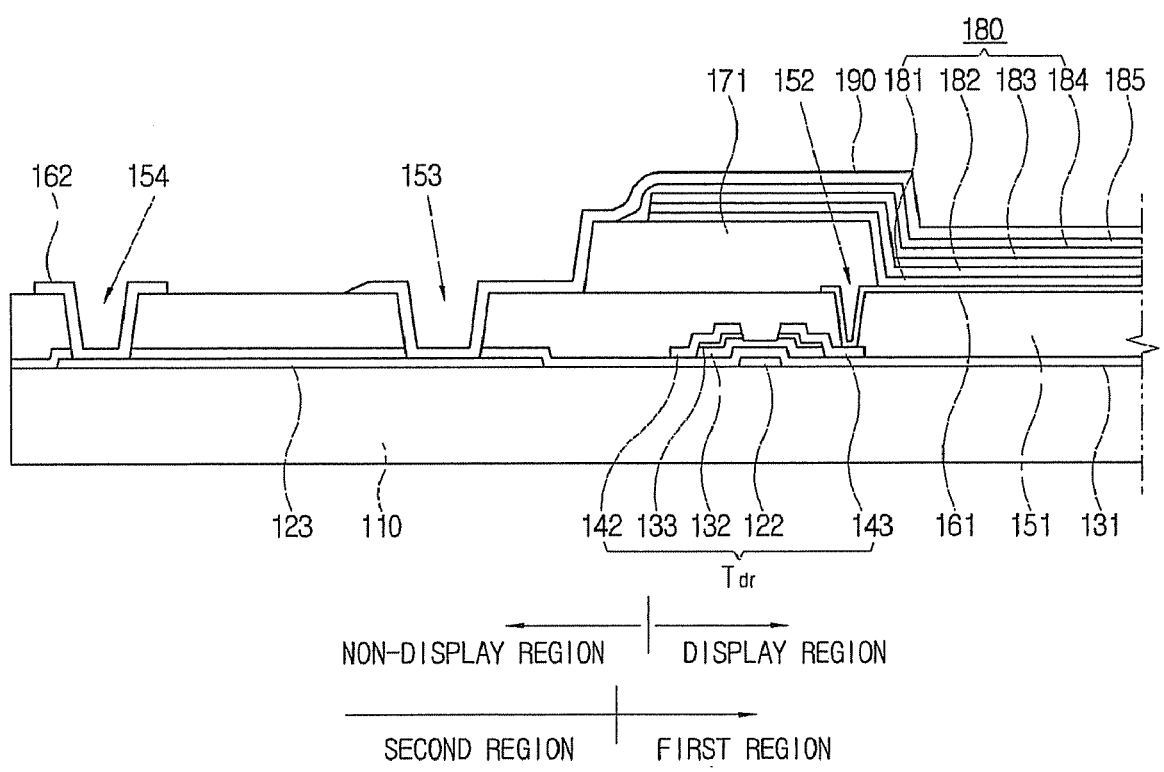
FIG. 5 is a sectional view taken along line V-V of FIG. 2A.
Figure 6:
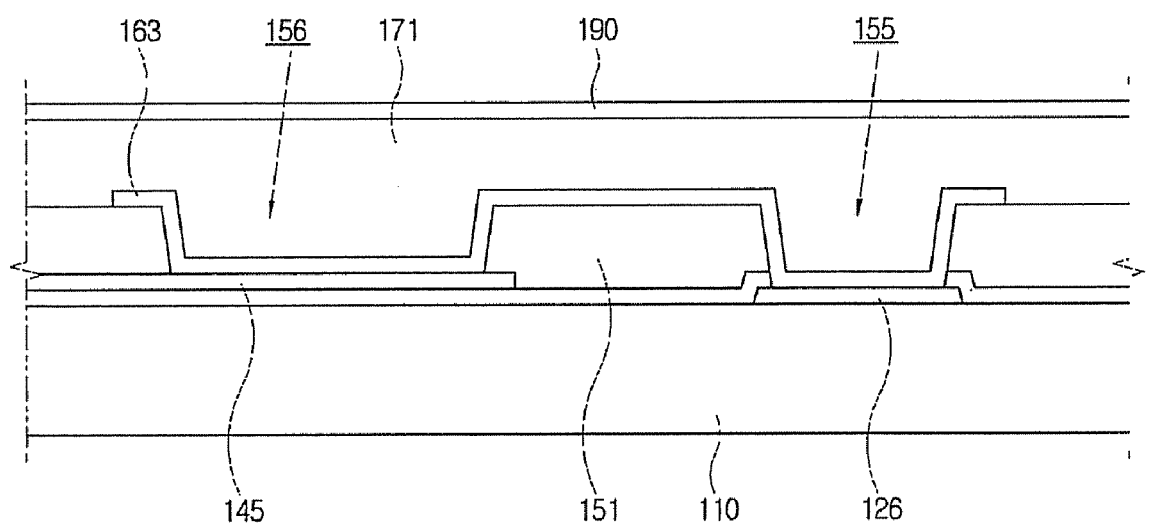
FIG. 6 is a sectional view taken along line VI-VI of FIG. 2B.

Below, the display apparatus according to the first exemplary embodiment will be described in more detail with reference to FIGS. 2A through 6. FIG. 2A illustrates the display apparatus except for a data driver 400, a gate driver 500, a driving voltage medium 611, and a common voltage medium 622, which are shown in FIG. 3. FIGS. 5 and 6 illustrate only the driving TFT Tdr.

Figure 4:
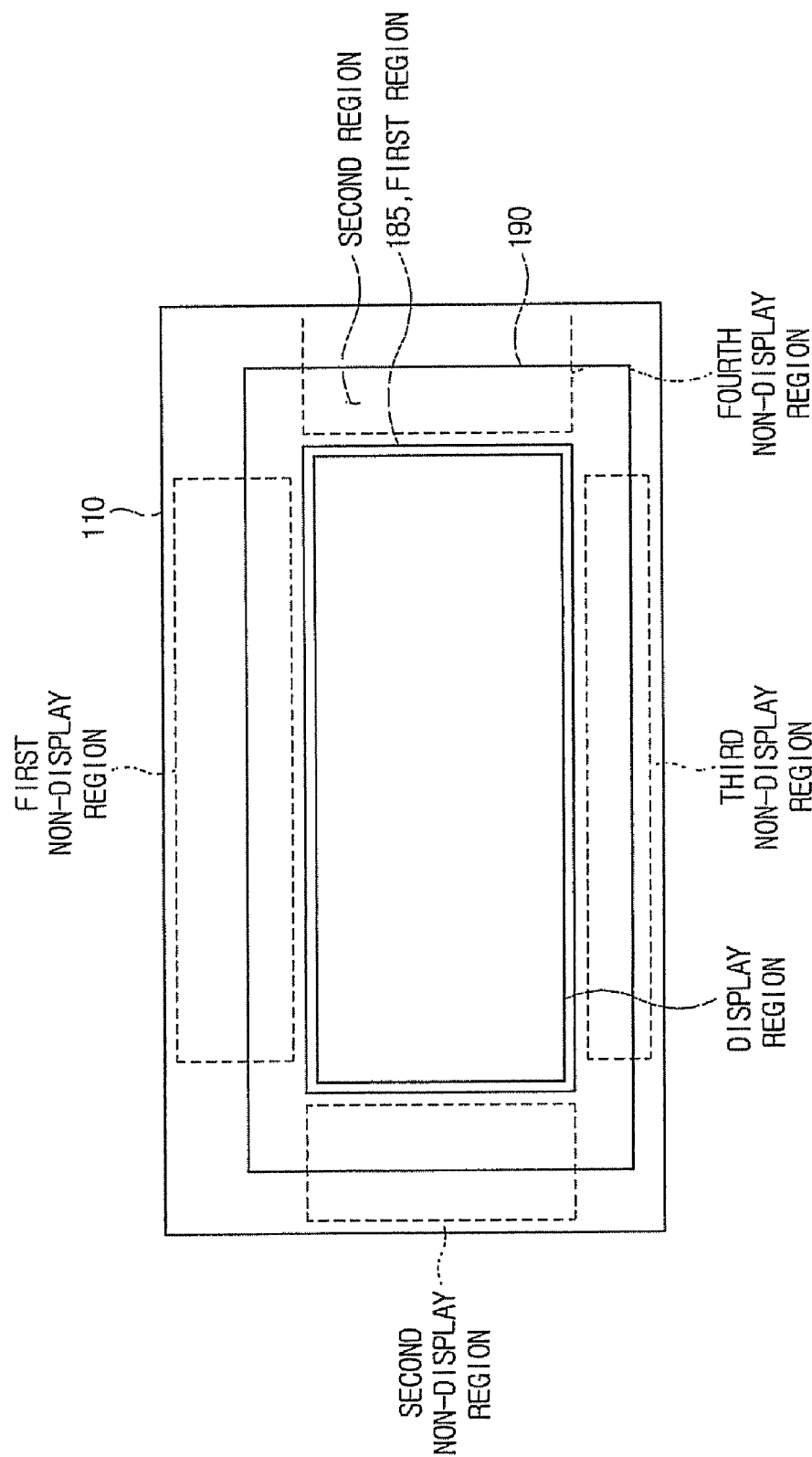
FIG. 4 illustrates regions of the exemplary display apparatus according to the first exemplary embodiment of the present invention.

A first insulating substrate 110 includes a rectangular display region, and a non-display region surrounding the display region, as shown in FIG. 4.

First, the non-display region will be described below.

Figure 2B:
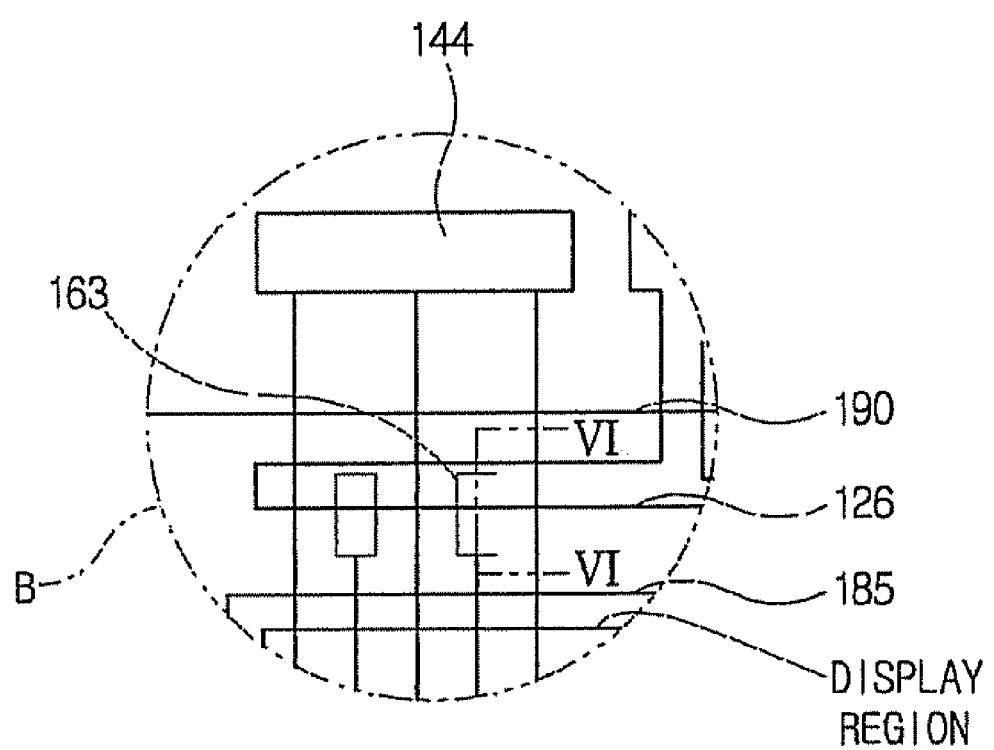
FIG. 2B is an enlarged view of portion B in FIG. 2A.
Figure 3:
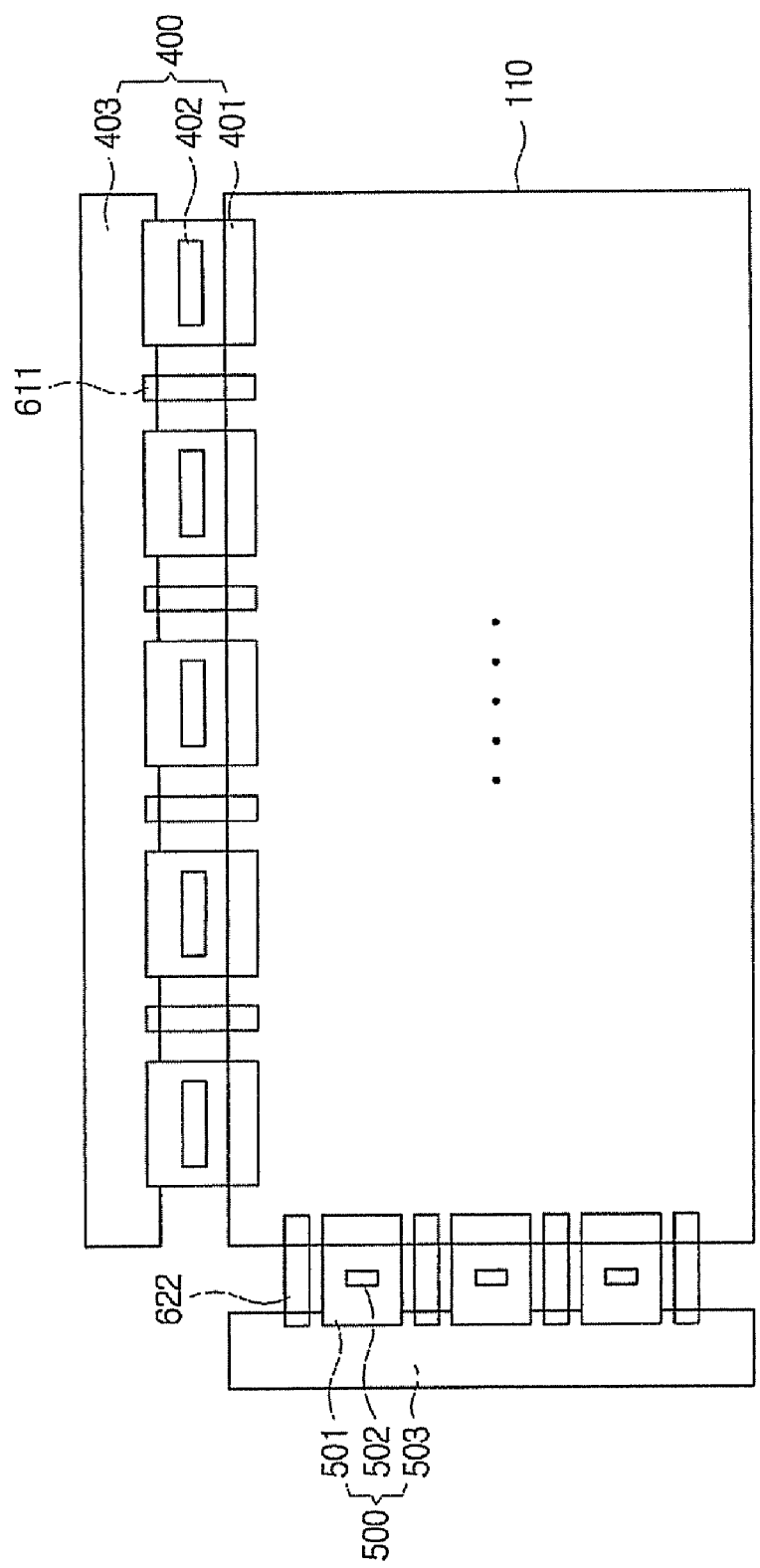

In the non-display region, a first non-display region adjacent to a top side of the display region is provided with a data pad 144, as shown in FIGS. 2A and 2B, connected to the data driver 400, shown in FIG. 3. Further, the data pad 144 is connected with the data line 141 extended toward the display region.

The data pad 144 is plurally provided and the data pads 144 are spaced apart from each other at predetermined intervals. Further, a driving voltage pad 125, also shown in FIG. 2A, is provided between the data pads 144. The driving voltage pad 125 receives a driving voltage from the data driver 400 through the driving voltage medium 611, shown in FIG. 3.

Each driving voltage pad 125 is connected to a driving voltage bar 126 arranged in parallel with the gate line 121. Also, the driving voltage bar 126 is connected with the driving voltage line 145 extended in parallel with the data line 141.

As shown in FIG. 6, the driving voltage bar 126 and the driving voltage line 145 are formed in different layers of the display apparatus. Further, the driving voltage bar 126 and the driving voltage line 145 are connected with each other by a driving bridge 163 made of a transparent conductive material. To be connected by the driving bridge 163, contact holes 155 and 156 are formed through a passivation film 151 exposing the driving voltage bar 126 and the driving voltage line 145, respectively. On the driving bridge 163 are formed a partition wall 171 and a common electrode 190.

In the non-display region, a second non-display region, identified in FIG. 4, adjacent to a left side of the display region is provided with a gate pad 124, shown in FIG. 2A, connected to the gate driver 500, shown in FIG. 3. Further, the gate pad 124 is connected with the gate line 121 extended toward the display region.

The gate pad 124 is plurally provided and the gate pads 124 are spaced apart from each other at predetermined intervals. Further, a common voltage applying part 123, also shown in FIG. 2A, is provided between the gate pads 124. The common voltage applying part 123 receives a common voltage from the gate driver 500 through the common voltage medium 622, shown in FIG. 3.

The common voltage applying part 123 has a first end exposed through a contact hole 154 as shown in FIG. 5, and the exposed part is covered with a contact member 162. The contact member 162 is connected with the common voltage medium 622, so that the common voltage applying part 123 receives the common voltage.

Further, the common voltage applying part 123 has a second end facing the display region and exposed through a contact hole 153, and the exposed part is connected to the common electrode 190. As shown in FIG. 4, the common electrode 190 is formed in the display region (i.e., the first region) and the second region surrounding the display region. Thus, the second region having the common electrode 190 overlaps portions of the first, second, third, and fourth non-display regions.

In the non-display region of one exemplary embodiment, third and fourth non-display regions each placed adjacent to bottom and right sides of the display region include no separate component.

Meanwhile, the data driver 400 includes a flexible printed circuit film 401, a data driving chip 402, and a data circuit board 403. The gate driver 500 includes a flexible printed circuit film 501, a gate driving chip 502, and a gate circuit board 503.

Next, the display region will be described as follows.

The gate line 121 and the gate electrode 122, shown in FIG. 5, are formed on the first insulating substrate 110 made of an insulating material such as glass, quartz, plastic or the like. The gate line 121 and the gate electrode 122 are formed in the same metal layer as the common voltage applying part 123, the gate pad 124, the driving voltage pad 125, and the driving voltage bar 126 of the non-display region. Here, the gate line 121 is connected with the gate pad 124.

A gate insulating film 131 including silicon nitride ($SiN_x$) or the like is formed on the gate line 121 and the gate electrode 122 and on exposed portions of the first insulating substrate 110.

A semiconductor layer 132 that is made of amorphous silicon ("a-S"), microcrystalline silicon, or crystalline silicon and an ohmic contact layer 133 that is made of n+ a-Si hydride highly doped with an n-type dopant are formed in sequence on the gate insulating film 131 corresponding to the gate electrode 122. Here, the ohmic contact layer 133 is separated into two parts with reference to the gate electrode 122, thus exposing a channel portion of the semiconductor layer 132.

The data line 141, a source electrode 142, and a drain electrode 143 are formed on the ohmic contact layer 133 and the gate insulating film 131. Further, the source electrode 142 and the drain electrode 143 are separated with reference to the gate electrode 122. Also, the data line 141, the source electrode 142, and the drain electrode 143 are formed in the same metal layer as the data pad 144 of the non-display region and the driving voltage line 145.

A passivation film 151 is formed on the source electrode 142, the drain electrode 143, an upper part of the semiconductor layer 132 exposed between the source and drain electrodes 142 and 143, and on other exposed portions of the gate insulating film 131. The passivation film 151 may include silicon nitride ($SiN_x$). In addition to the contact holes 153 and 154, the passivation film 151 is further partially removed to form a contact hole 152 exposing the drain electrode 143.

A pixel electrode 161 is formed on the passivation film 151. The pixel electrode 161 supplies a hole to an organic layer 180. The pixel electrode 161 includes a transparent conductive material such as indium tin oxide ("ITO"), indium zinc oxide ("IZO"), etc., and is connected to the drain electrode 143 through the contact hole 152. Here, the pixel electrode 161 is formed in the same transparent conductive layer as the driving bridge 163 and the contact member 162 of the non-display region.

A partition wall 171 is formed on the pixel electrode 161 and the passivation film 151 and surrounds the pixel electrode 161. The partition wall 171 divides adjacent pixel electrodes 161 from each other and defines pixel regions. Further, the partition wall 171 prevents the source and drain electrodes 142 and 143 of the driving TFT Tdr from being short-circuited with the common electrode 190. The partition wall 171 may include a photosensitive material such as an acrylic resin, a polyimide resin, etc., which has heat resistance and solvent resistance, and an inorganic material such as $SiO_2$ and $TiO_2$. Further, the partition wall 171 may have a double structure of an organic layer and an inorganic layer.

An organic layer 180 is formed on the pixel electrode 161 that is not covered with the partition wall 171. The organic layer 180 is substantially formed in a region corresponding to the display region.

The organic layer 180 may include a hole injecting layer 181, a hole transfer layer 182, a light emitting layer 183, and an electron transfer layer 184. In one exemplary embodiment, the organic layer 180 is formed by a dry process, such as a heat evaporation process.

In the organic layer 180, the hole injecting layer 181, the hole transfer layer 182, and the electron transfer layer 184 are each formed in common on all of the pixel electrodes 161 and the partition wall 171. The light emitting layer 183 includes a plurality of light emitting sub-layers different in light color. Alternatively, in the case where the light emitting layer 183 emits white light, the light emitting layer 183 can be also formed in common on all of the pixel electrodes 161. In the case where the light emitting layer 183 emits white color, a color filter may be formed between the first insulating substrate 110 and each pixel electrode 161. Here, the light emitting layer 183 emitting the white light can be formed by stacking three light emitting materials that emit light of red, green and blue, respectively.

For the hole injecting layer 181 and the hole transfer layer 182, it is preferable but not necessary to use amine derivatives having strong fluorescence, for instance, triphenyldiamine derivatives, styrylamine derivatives, and amine derivatives having an aromatic fused ring.

For the electron transfer layer 184, it is preferable but not necessary to use quinoline derivatives, in particular, aluminum tris(8-hydroxyquinoline), Alq3. It is also preferable but not necessary to use phenyl anthracene derivatives and tetraarylethene derivatives.

On the organic layer 180 is formed an electron injecting layer 185. The electron injecting layer 185 includes barium (Ba) or calcium (Ca) and may be formed by the heat evaporation process. Here, the electron injecting layer 185 is not formed on the common voltage applying part 123 that is formed on the second region within the non-display region.

On the electron injecting layer 185 is formed the common electrode 190. The common electrode 190 supplies electrons to the light emitting layer 183. The common electrode 190 contains aluminum (Al) and may also be formed by the heat evaporation process. Preferably, the common electrode 190 has a thickness of about 4,000 Å through 8,000 Å. Here, the common electrode 190 is formed throughout the first region, thus encompassing the display region, and the second region, within the non-display region, surrounding the first region. In the meantime, with reference to FIGS. 2A and 4, the width (W2) of the second region corresponding to the opposing second and fourth non-display regions is wider than the width (W1) of the second region corresponding to the opposing first and third non-display regions.

The common electrode 190 is connected to the common voltage applying part 123 within the second region via contact hole 153 as shown in FIG. 5.

The hole transferred from the pixel electrode 161 and the electron transferred from the common electrode 190 are combined into an exciton, and light is emitted.

In the foregoing display apparatus, the organic layer 180 deteriorates by moisture and oxygen. Thus, the display apparatus may further include an encapsulation plate.

Figure 7:
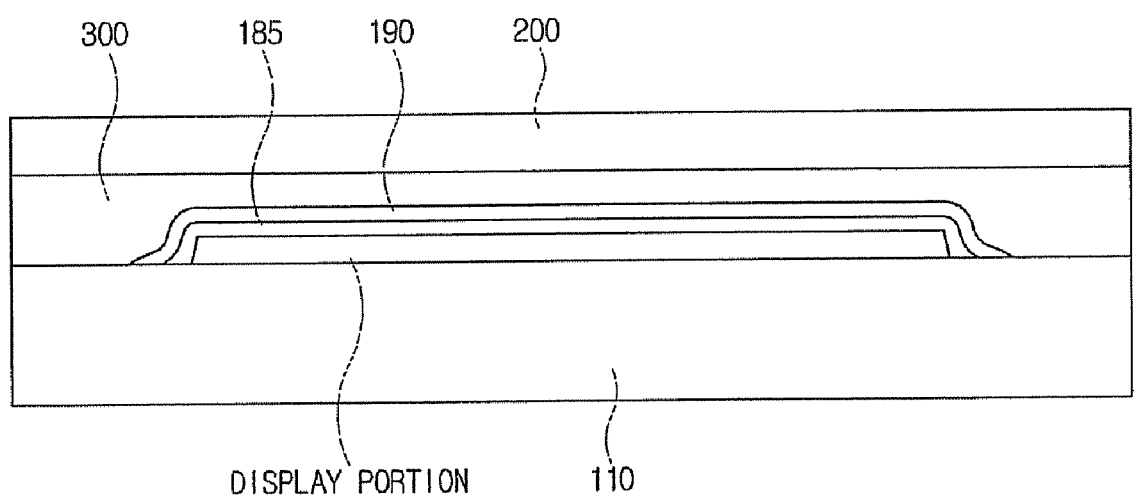
FIG. 7 is a schematic sectional view of the exemplary display apparatus including an exemplary encapsulation plate according to the first exemplary embodiment of the present invention.

FIG. 7 is a schematic sectional view of the exemplary display apparatus including an encapsulation plate according to the first exemplary embodiment of the present invention.

A display portion is formed on the insulating substrate 110, and the electron injecting layer 185 is formed on the display portion. Here, the display portion indicates a portion between the insulating substrate 110 and the electron injecting layer 185. On the electron injecting layer 185 is formed the common electrode 190. As described above, the common electrode 190 is formed in a region larger than the electron injecting layer 185.

Here, each of the electron injecting layer 185 and the common electrode 190 has a gently inclined outer profile because they are formed by diffusion, which will be further described below.

On the common electrode 190 is formed a sealant 300, and an encapsulation plate 200 is attached to the insulating substrate 110 through the sealant 300. The encapsulation plate 200 and the sealant 300 protect the organic layer 180 from moisture and oxygen. Here, the encapsulation plate 200 may be made of, by example only, glass or stainless steel, and the sealant 300 may be made of thermosetting resin or ultraviolet ("UV") hardening resin.

The electron injecting layer 185 made of barium or calcium is likely to be oxidized if it comes in contact with the sealant 300. However, according to the exemplary embodiment, the electron injecting layer 185 is covered with the common electrode 190, thereby preventing the electron injecting layer 185 from being in direct-contact with the sealant 300.

Below, an exemplary method of fabricating the exemplary display apparatus according to the first exemplary embodiment of the present invention will be described.

Figure 8A:
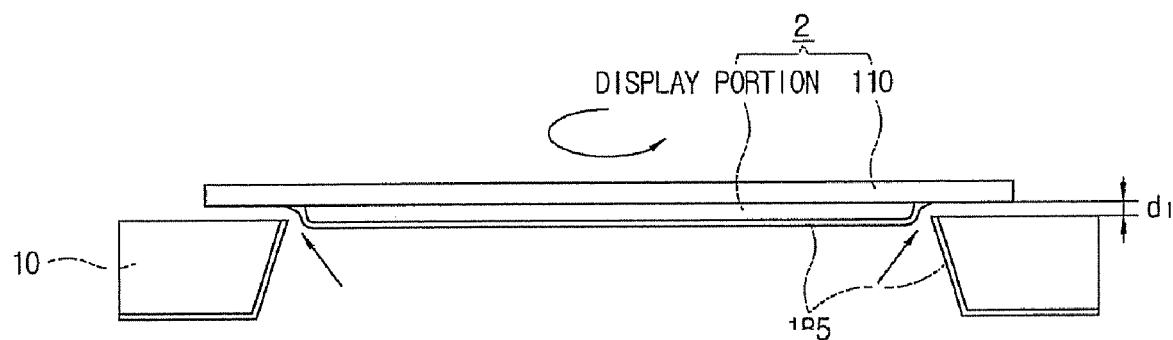
FIGS. 8A through 8C illustrate an exemplary fabricating method of the exemplary display apparatus according to the first exemplary embodiment of the present invention.
Figure 8A:
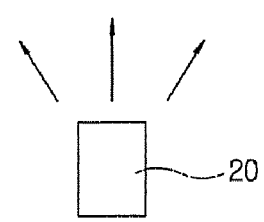
Figure 8B:
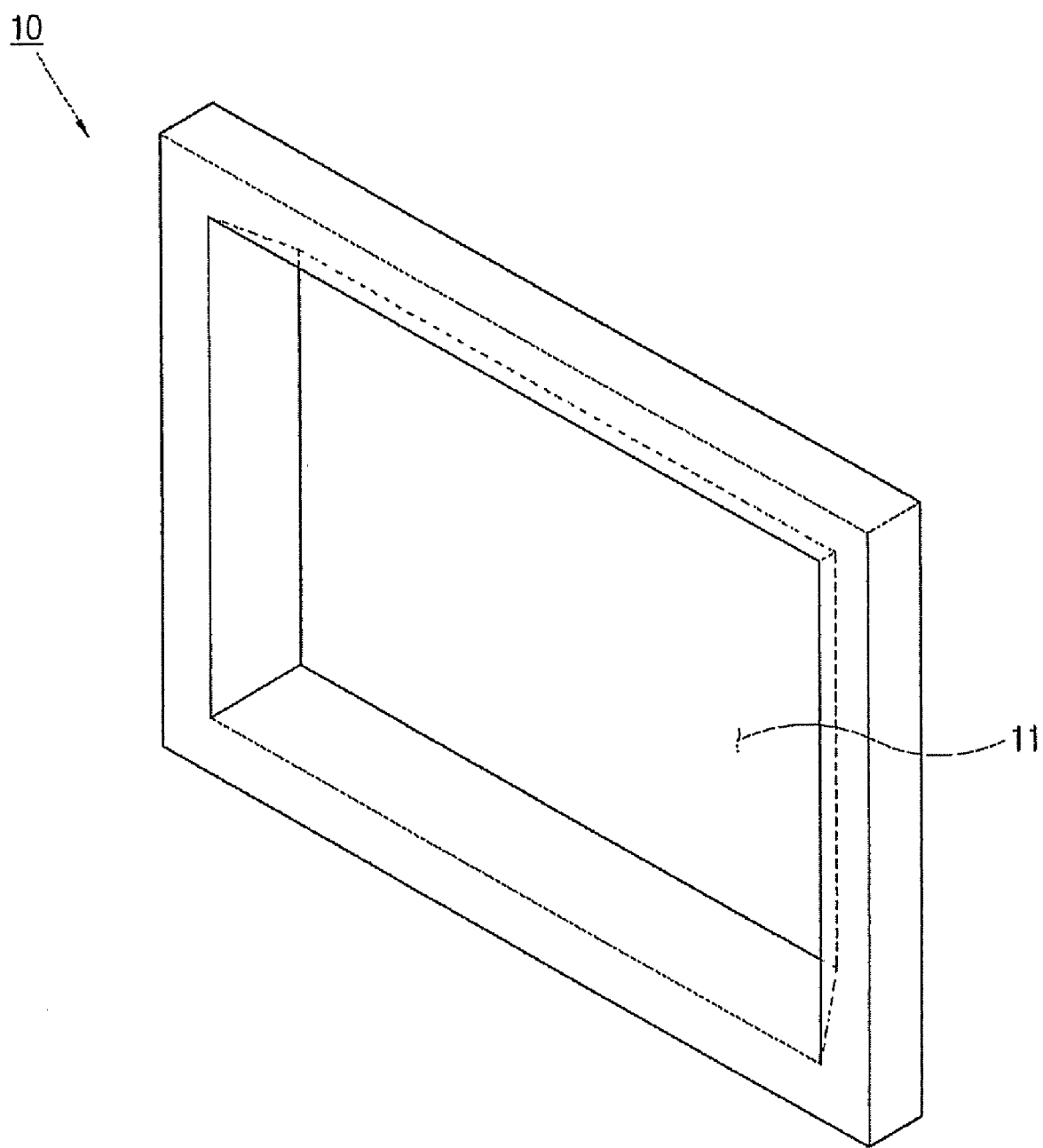
Figure 8C:
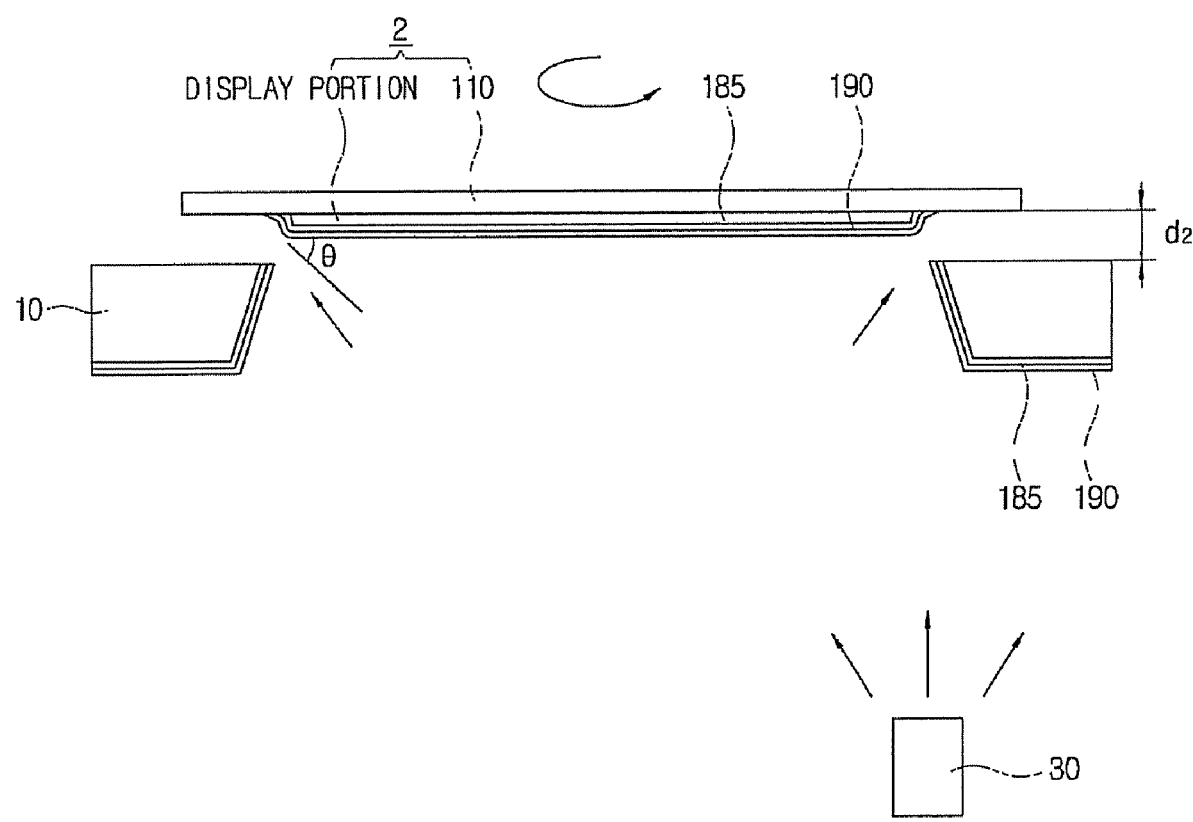

FIGS. 8A through 8C illustrate an exemplary fabricating method of the exemplary display apparatus according to the first exemplary embodiment of the present invention.

FIG. 8A illustrates the electron injecting layer 185 formed on a deposition-objective substrate 2 having the display portion including the organic layer 180 formed on the first insulating substrate 110.

The deposition-objective substrate 2 may be disposed so that the organic layer 180 faces downward. Further, the deposition-objective substrate 2 rotates on its own axis in a horizontal plane. Then, a mask 10 is disposed to be spaced apart from the deposition-objective substrate 2 at a first distance "d1," thereby determining a region for the electron injecting layer 185. Here, the mask 10 rotates along with the deposition-objective substrate 2.

The mask 10 is shaped like a window frame as shown in FIG. 8B, and has a rectangular opening 11 corresponding to the display region.

Under the deposition-objective substrate 2 is provided an electron injection material source 20. Thus, the electron injection material source 20 supplies vapor of an electron injection material to the deposition-objective substrate 2.

In an exemplary embodiment, the electron injection material source 20 is not aligned with the center of the deposition-objective substrate 2 but leans to the right or is otherwise positioned off-center with respect to the display portion of the deposition-objective substrate 2. In this state, the deposition-objective substrate 2 rotates on its own axis, with the mask 10, and the electron injection material is uniformly deposited on the deposition-objective substrate 2. In this portion of the method, the mask 10 may also be covered with the electron injection material that forms the electron injecting layer 185.

Then, as shown in FIG. 8C, the mask 10 is disposed to be spaced apart at a second distance "d2" from the deposition-objective substrate 2 formed with the electron injecting layer 185, and then the common electrode 190 is formed. To adjust the distance between the deposition-objective substrate 2 and the mask 10, the mask 10 and the deposition-objective substrate 2 are relatively moved not in a horizontal direction but in a vertical direction. Here, the second distance d2 for the common electrode 190 is a little larger than the first distance d1.

In this portion of the method, a common electrode material source 30 is disposed under the deposition-objective substrate 2. Thus, the common electrode material source 30 supplies vapor of a common electrode material to the deposition-objective substrate 2 that was previously covered with the electron injecting layer 185. In this portion of the method, the mask 10 may further be covered with the common electrode material that forms the common electrode layer 190.

In one exemplary embodiment of the method, the common electrode material source 30 is not aligned with the center of the deposition-objective substrate 2 but leans to the right or is otherwise positioned off-center with respect to the display portion of the deposition-objective substrate 2. In this state, the deposition-objective substrate 2 rotates on its own axis with the mask 10.

During the deposition process, diffusion arises through the space between the mask 10 and the deposition-objective substrate 2, so that the electron injecting layer 185 and the common electrode 190 are formed in a region larger than the opening 11 of the mask 10.

However, the space between the mask 10 and the deposition-objective substrate 2 for forming the common electrode 190 is larger than that for forming the electron injecting layer 185, since the mask 10 is spaced further from the deposition-objective substrate 2 during formation of the common electrode 190 than during formation of the electron injecting layer 185. Therefore, the common electrode 190 is formed in the region larger than that for the electron injecting layer 185. Meanwhile, each outer profile of the electron injecting layer 185 and the common electrode 190 is gently inclined because they are formed by diffusion.

Disposition between the non-display region and the common electrode material source 30 is as follows.

The minimum angle θ between the common electrode material source 30 and the deposition-objective substrate 2 in the second non-display region is smaller than that in the first non-display region because the display region is shaped like a rectangle instead of a square, and the second non-display region can be more distant from the common electrode material source 30 than the first non-display region. Thus, the vapor of the common electrode material in the second non-display region is more deeply diffused than that in the first non-display region. Therefore, the width of the common electrode 190 in the second non-display region is larger than that in the first non-display region. In other words, W2>W1 as shown in FIG. 2A.

Likewise, the width of the common electrode 190 in the fourth non-display region is larger than the third non-display region.

In this embodiment, the single mask 10 is used for forming the electron injecting layer 185 and the common electrode 190, which have different deposition regions. Therefore, both the electron injecting layer 185 and the common electrode 190 are formed without difficulty of using multiple masks, and changing and moving such masks between chambers.

Figure 9:
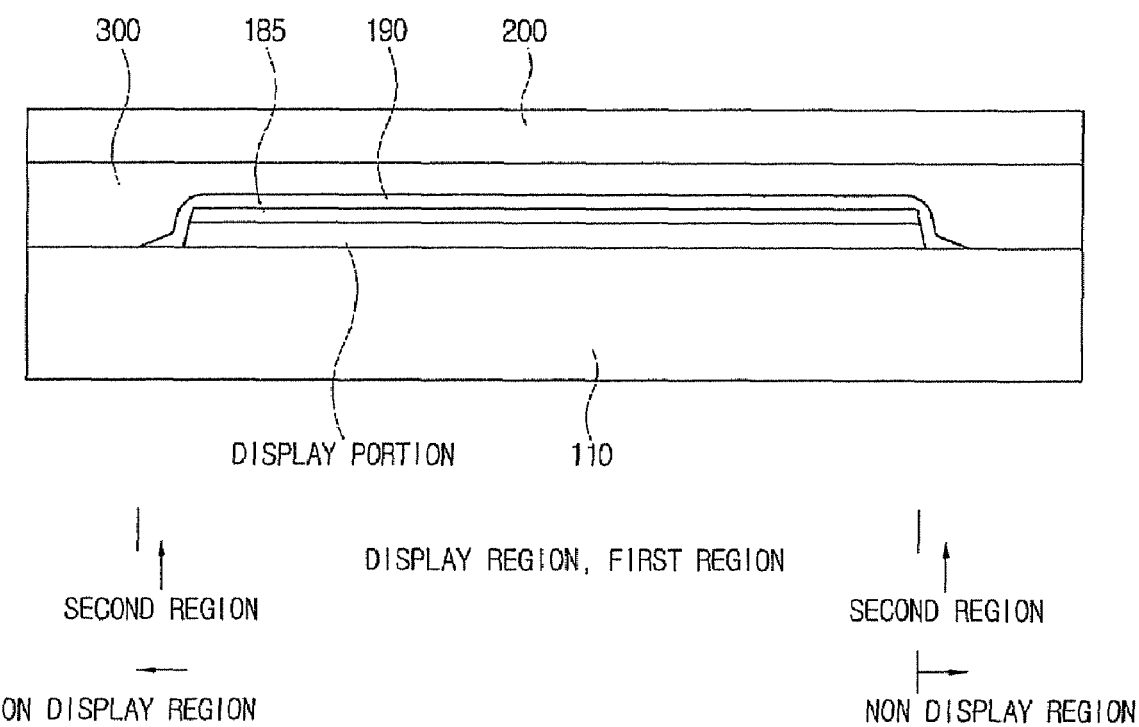
FIG. 9 is a schematic sectional view of an exemplary display apparatus according to a second exemplary embodiment of the present invention.

FIG. 9 is a schematic sectional view of an exemplary display apparatus according to a second exemplary embodiment of the present invention.

According to the second exemplary embodiment, an outer profile of an electron injecting layer 185 is steeply inclined because it is not formed by diffusion as in the prior embodiment, but an outer profile of a common electrode 190 is gently inclined because it is formed by diffusion. Further, in this exemplary embodiment, the electron injecting layer 185 is formed only in the display region, so that the first region is equal with the display region. In the following exemplary embodiments, the first region will be equal to the display region.

Below, an exemplary method of fabricating the exemplary display apparatus according to the second exemplary embodiment of the present invention will be described with reference to FIG. 10.

Figure 10:
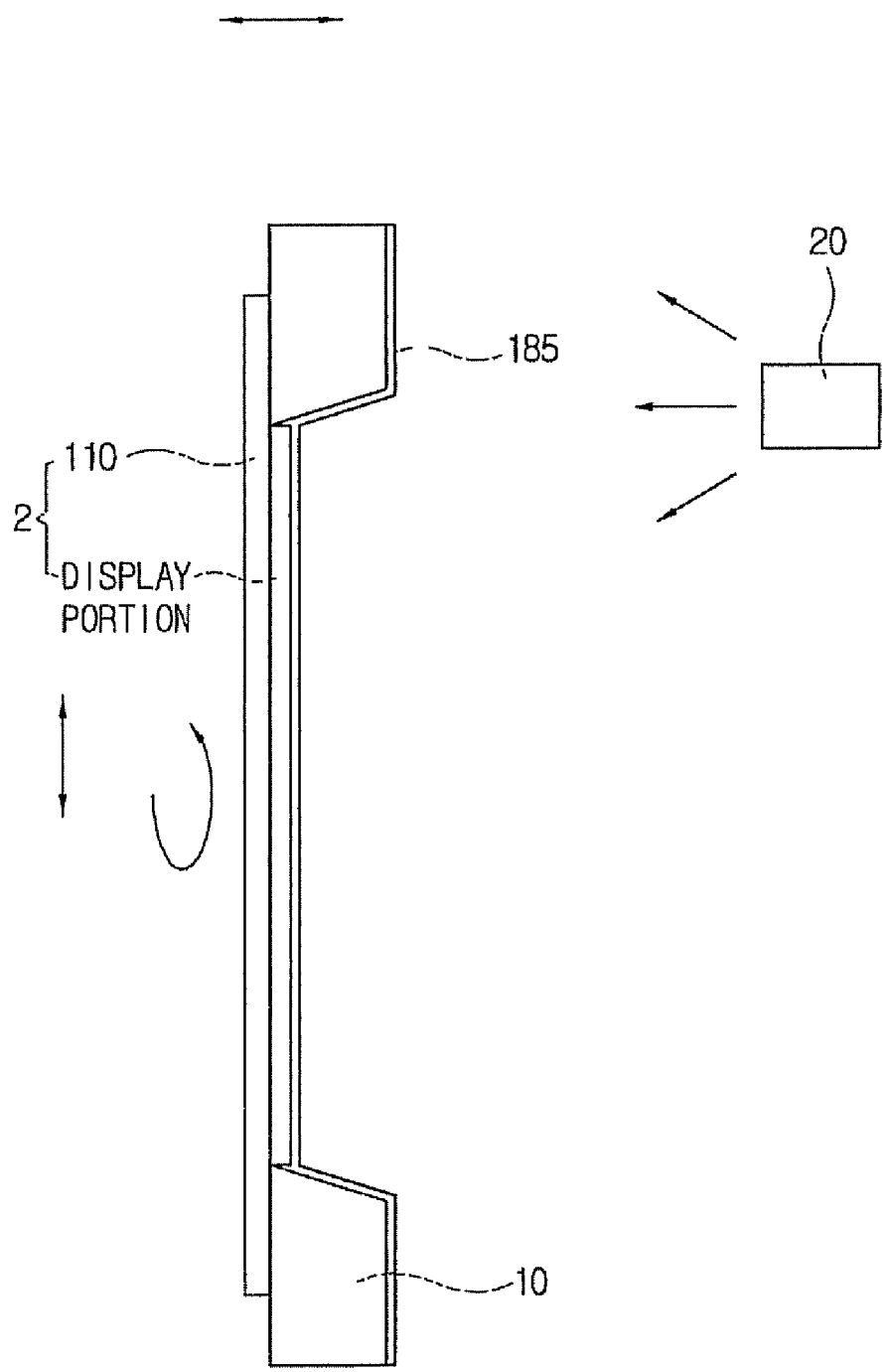
FIG. 10 illustrates an exemplary fabricating method of the exemplary display apparatus according to the second exemplary embodiment of the present invention.

FIG. 10 illustrates that the electron injecting layer 185 is formed on the deposition-objective substrate 2 having the organic layer 180, as in the prior embodiment.

However, in this exemplary embodiment, the deposition-objective substrate 2 is disposed in a standing direction and rotates on its own axis. A mask 10 is closely attached to the deposition-objective substrate 2, thereby determining a forming region of the electron injecting layer 185. Here, the mask 10 rotates along with the deposition-objective substrate 2.

An electron injection material source 20 is provided in front of the deposition-objective substrate 2, so that the electron injection material source 20 supplies vapor of an electron injection material to the deposition-objective substrate 2. To obtain uniform deposition, the deposition-objective substrate 2 moves upward and downward or forward and backward. As the mask 10 is attached to the deposition-objective substrate 2, the electron injection material may be further formed on the mask 10.

In this embodiment, because the mask 10 is closely attached to the deposition objective substrate 2, the vapor of the electron injection material is not diffused between the mask 10 and the deposition-objective substrate 2. Therefore, the electron injection layer 185 has a periphery limited by the opening 11 of the mask 10 and thus has a steeply inclined outer profile.

Then, the common electrode 190 is formed in the state where the mask 10 is spaced apart from the deposition-objective substrate 2. Thus, vapor of a common electrode material is diffused between the mask 10 and the deposition substrate 2, so that the common electrode 190 has a gently inclined outer profile, such as previously shown in FIG. 8C.

Below, an exemplary display apparatus according to a third exemplary embodiment of the present invention will be described with reference to FIGS. 11A, 11B, and 12.

Figure 11A:
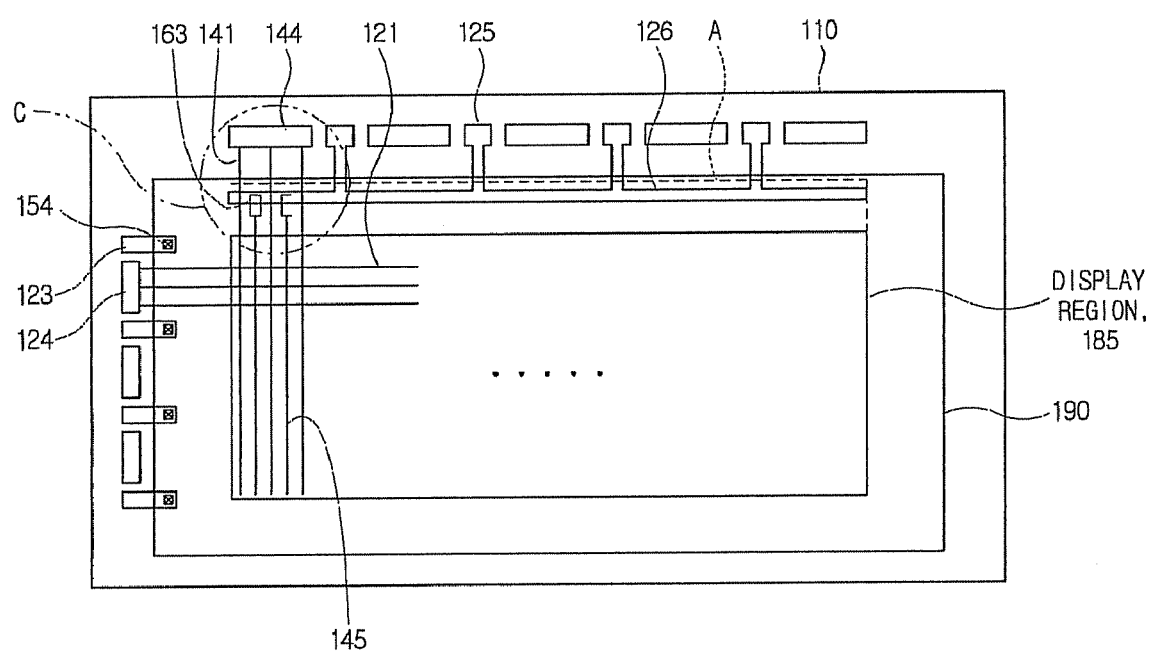
FIG. 11A is a layout diagram of an exemplary display apparatus according to a third exemplary embodiment of the present invention.
Figure 11B:
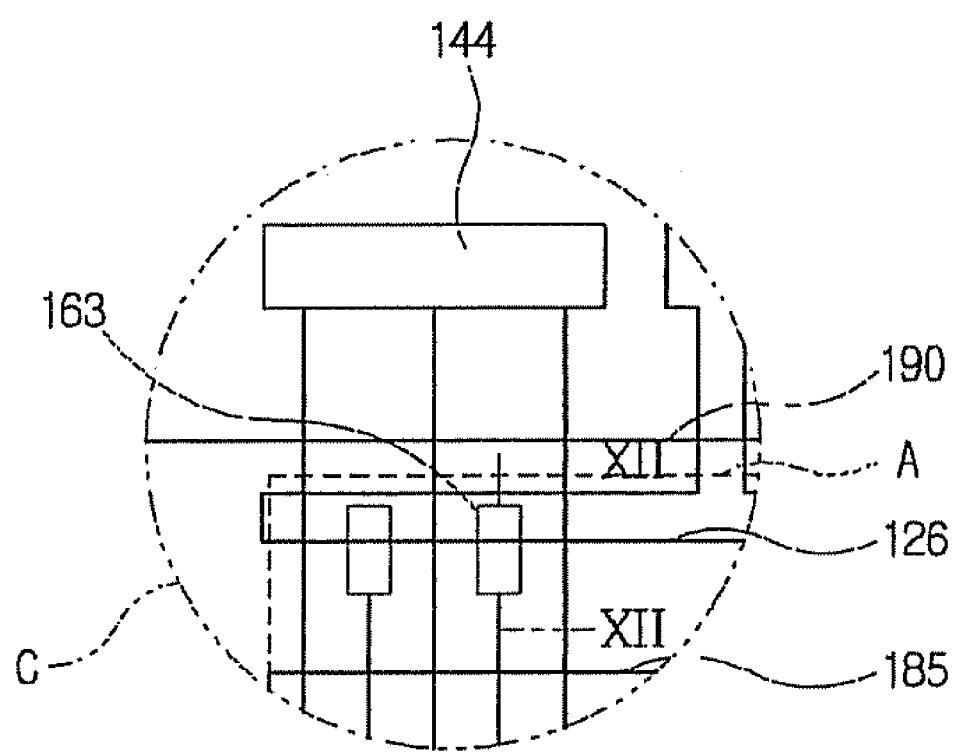
FIG. 11B is an enlarged view of portion C of FIG. 11A.
Figure 12:
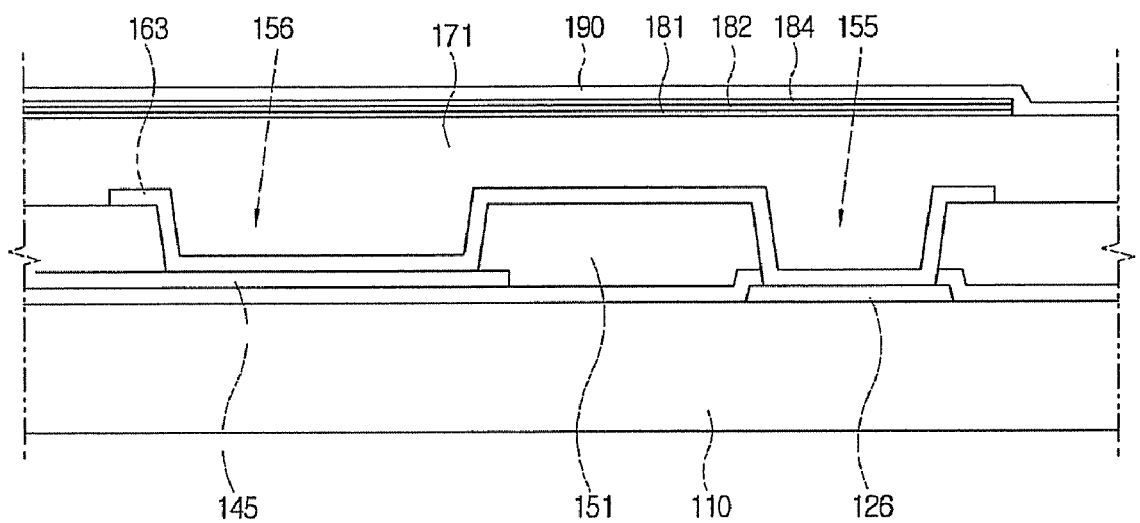
FIG. 12 is a sectional view taken along line XII-XII of FIG. 11B.

FIG. 11A is a layout diagram of an exemplary display apparatus according to a third exemplary embodiment of the present invention, FIG. 11B is an enlarged view of portion C in FIG. 11A, and FIG. 12 is a sectional view taken along line XII-XII of FIG. 11B.

In the exemplary display apparatus according to the third exemplary embodiment of the present invention, an organic layer 180 is partially extended to the outside of a display region. In other words, common layers of the organic layer 180, such as a hole injecting layer 181, a hole transfer layer 182, an electron transfer layer 184 or the like with the exception of a light emitting layer 183, are extended to a region A, i.e., to the top of the display region within a portion of the first non-display region.

As shown in FIG. 12, the common layers 181, 182, and 184 are expanded to the region A and are disposed between a driving bridge 163 and a common electrode 190. Between the driving bridge 163 and the common electrode 190 are provided the common layers 181, 182, and 184 along with a partition wall 171. Thus, short-circuit between the driving bridge 163 and the common electrode 190 is prevented.

The common layers 181, 182, and 184 are deposited through a mask having an opening with no separate pattern. Therefore, the opening of the mask may simply be changed in order to extend the common layers 181, 182, and 184 to the region A.

On the other hand, the light emitting layer 183 is formed through a shadow mask having a patterned opening corresponding to each of the pixel electrodes 161. Alternatively, the light emitting layer 183 may also extended to the region A by changing the shadow mask.

Figure 13:
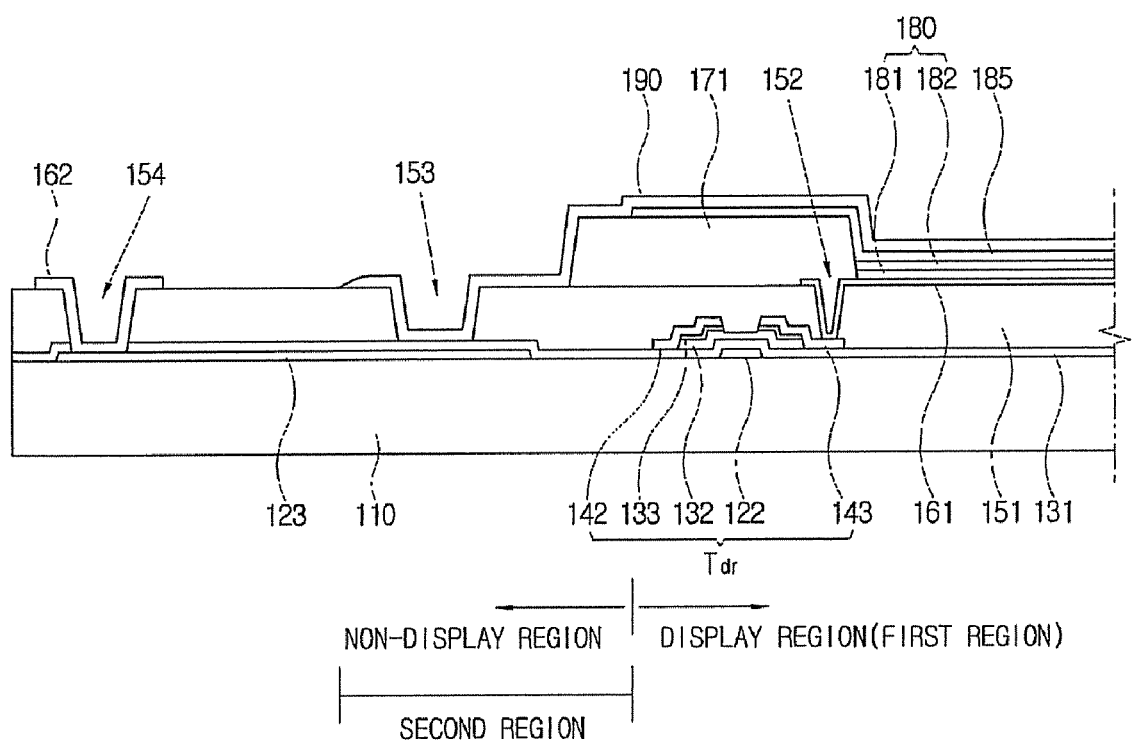
FIG. 13 is a sectional view of an exemplary display apparatus according to a fourth exemplary embodiment of the present invention.

FIG. 13 is a sectional view of an exemplary display apparatus according to a fourth exemplary embodiment of the present invention, corresponding to the sectional view taken along line V-V of FIG. 2A.

According to the fourth exemplary embodiment of the present invention, an organic layer 180 includes a hole injecting layer 181 and a light emitting layer 183. The organic layer 180 includes a polymer, and may be formed by an inkjet method. Here, the hole injecting layer 181 and the light emitting layer 183 are not formed on a partition wall 171 but formed only on the pixel electrode 161 within the openings defined by the partition wall 171.

The hole injecting layer 181 may include a hole injection material such as poly(3,4-ethylenedioxy thiophene) ("PEDOT") and polystyrene sulfonic acid ("PSS") The light emitting layer 183 may include polyfluorene derivatives, (poly) paraphenylenevinylene derivatives, polyphenylene derivatives, polyvinyl cabazole, polythiophene derivatives, or such polymer materials doped with pherylene pigment, rhodamine pigment, rubrene, pherylene, 9,10-diphenylantracen, tetraphenylbutadienem, nile-red, coumarin 6, quinacridone, etc.

The electron injecting layer 185 is formed on the whole organic layer 180 and may include lithium (Li) and fluorine (F). The common electrode layer 190 may cover the entire electron injecting layer 185 and expand partially into the non-display region, as in the prior exemplary embodiments.

Figure 14:
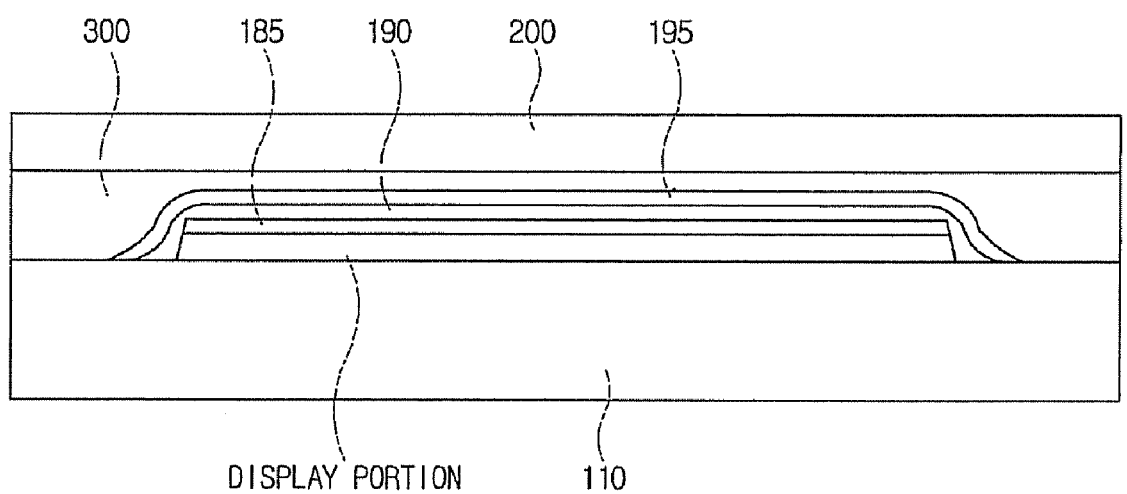
FIG. 14 is a sectional view of an exemplary display apparatus according to a fifth exemplary embodiment of the present invention.

Below, an exemplary display apparatus according to a fifth exemplary embodiment of the present invention will be described with reference to FIGS. 14 and 15. FIG. 14 is a sectional view of an exemplary display apparatus according to a fifth exemplary embodiment of the present invention, and FIG. 15 illustrates an exemplary fabricating method of the exemplary display apparatus according to the fifth exemplary embodiment of the present invention.

As shown in FIG. 14, the exemplary display apparatus according to the fifth exemplary embodiment of the present invention further includes an encapsulation passivation film 195 formed on the common electrode 190. The encapsulation passivation film 195 further protects an organic layer 180 from moisture and oxygen. Further, the encapsulation passivation film 195 is formed in a region larger than that of the common electrode 190, and may have a relatively gentle outer profile as illustrated.

Figure 15:
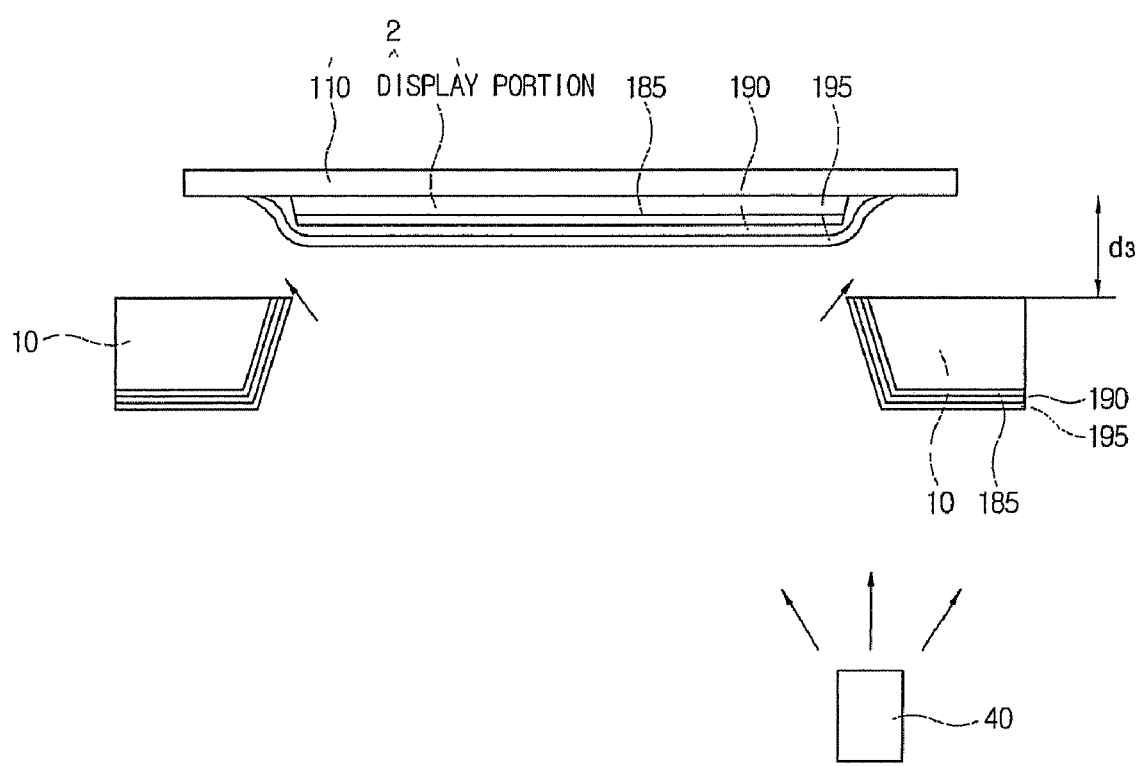
FIG. 15 illustrates an exemplary fabricating method of the exemplary display apparatus according to the fifth exemplary embodiment of the present invention.

As shown in FIG. 15, the encapsulation passivation film 195 may be formed by spacing a mask 10 apart from a deposition-objective substrate 2 by a third distance d3, and supplying vapor of an encapsulation passivation material from an encapsulation passivation material source 40. The encapsulation passivation material may also cover the mask 10 as shown.

The third distance d3 for the encapsulation passivation film 195 is larger than the distance d2 in which the mask 10 was spaced apart from the deposition-objective substrate 2 for formation of the common electrode 190. Thus, the encapsulation passivation film 195 is formed in a region larger than that of the common electrode 190. Further, the vapor of the encapsulation passivation material is diffused between the mask 10 and the deposition-objective substrate 2, so that the encapsulation passivation film 195 has a gentle outer profile.

According to the fifth exemplary embodiment, the electron injecting layer 185, the common electrode 190, and the encapsulation passivation film 195 can be formed using the single mask 10.

Figure 16:
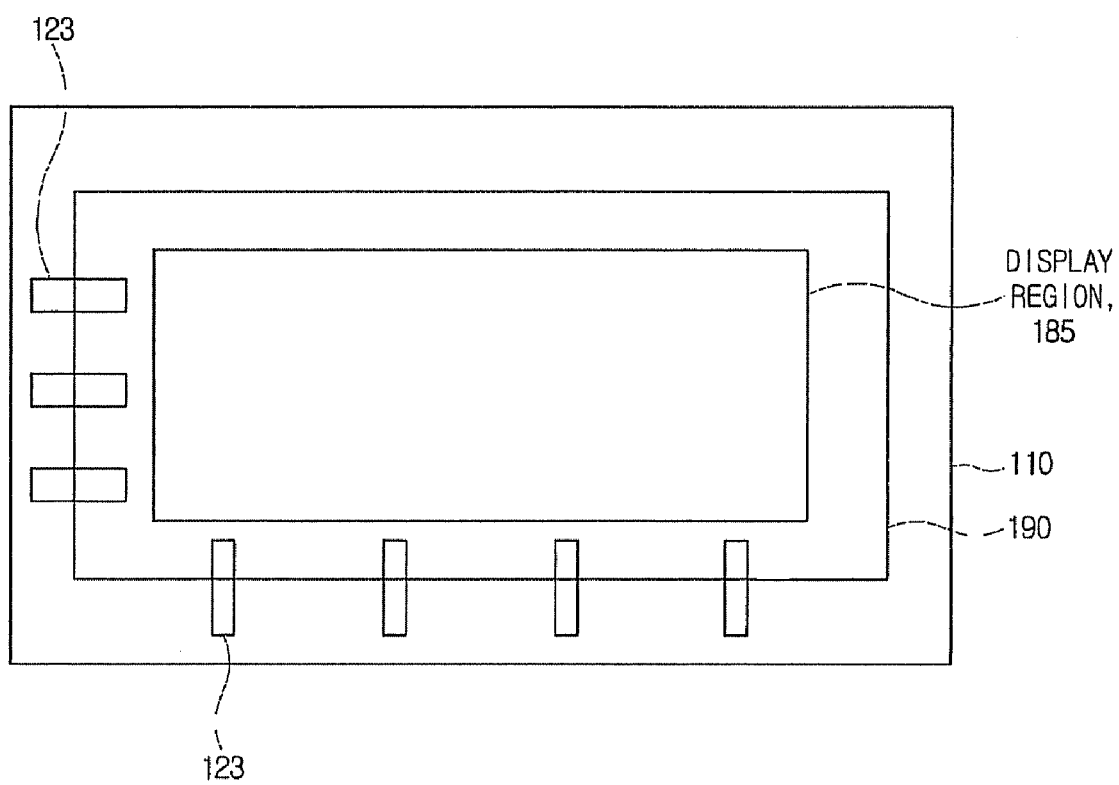
FIG. 16 is a layout diagram of an exemplary display apparatus according to a sixth exemplary embodiment of the present invention.

FIG. 16 is a layout diagram of an exemplary display apparatus according to a sixth exemplary embodiment of the present invention.

A common voltage applying part 123 is placed adjacent to left and bottom sides of a display region having the electron injecting layer 185, and a common electrode 190 in the left side of the display region is larger than that that in the bottom side. Thus, the common voltage applying part 123 in the left side of the display region is larger than that in the bottom side.

According to the sixth exemplary embodiment of the present invention, the size of the common voltage applying part 123 can be adjusted by considering a deposition region of the common electrode 190, thereby increasing contact between the common electrode 190 and the common voltage applying part 123.

As described above, the present invention provides a method of fabricating a display apparatus, in which a single mask is used in forming an electron injection layer and a common electrode.

Further, the present invention provides a display apparatus, in which a single mask is used in forming an electron injection layer and a common electrode.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of fabricating a display apparatus, the method comprising:
  depositing a first layer on a substrate while a mask is disposed at a first distance from the substrate; and
  forming a second layer on the substrate while the mask is disposed at a second distance larger than the first distance from the substrate after forming the first layer,
  wherein depositing the first layer includes depositing an electron injecting material to form an electron injecting layer, and forming the second layer includes depositing a common electrode material to form a common electrode.

2. The method according to claim 1, wherein depositing the first layer includes forming the first layer in a first region, and forming the second layer includes forming the second layer in the first region and in a second region surrounding the first region.

3. The method according to claim 2, further comprising forming an encapsulation passivation film on the second layer while the mask is disposed at a third distance larger than the second distance from the substrate.

4. The method according to claim 2, wherein the first region corresponds to a display region.

5. The method according to claim 2, wherein depositing the first layer and forming the second layer include using a heat evaporation process.

6. The method according to claim 5, wherein the substrate is formed with an organic layer thereon, and depositing the first layer and forming the second layer are performed in a state where the organic layer of the substrate is disposed to face downward.

7. The method according to claim 5, wherein the substrate is formed with an organic layer thereon, and depositing the first layer and forming the second layer are performed in a state where the substrate is disposed in a standing direction.

8. The method according to claim 1, wherein the substrate is provided by
　　forming a thin film transistor on an insulating substrate;
　　forming a pixel electrode connected to the thin film transistor; and
　　forming an organic layer on the pixel electrode.

9. The method according to claim 8, wherein the organic layer comprises material of low molecular weight, and the first layer comprises lithium (Li) and fluorine (F).

10. The method according to claim 8, wherein the organic layer comprises polymer, and the first layer comprises calcium (Ca) and barium (Ba).

11. The method according to claim 1, wherein the second layer comprises aluminum (Al).

12. The method according to claim 1, wherein the second layer has a thickness between 4,000 Å and 8,000 Å.

* * * * *